(12) United States Patent
Lin et al.

(10) Patent No.: US 9,773,911 B2
(45) Date of Patent: Sep. 26, 2017

(54) FIN FIELD EFFECT TRANSISTOR AND FABRICATING METHOD THEREOF

(71) Applicant: Taiwan Semiconductor Manufacturing Co., Ltd., Hsinchu (TW)

(72) Inventors: Wen-Sheng Lin, Tainan (TW); Chen-Chieh Chiang, Kaohsiung (TW); Chi-Cherng Jeng, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/016,278

(22) Filed: Feb. 5, 2016

(65) Prior Publication Data

US 2017/0229580 A1   Aug. 10, 2017

(51) Int. Cl.

| H01L 31/119 | (2006.01) |
|---|---|
| H01L 29/78 | (2006.01) |
| H01L 29/66 | (2006.01) |
| H01L 29/06 | (2006.01) |
| H01L 29/10 | (2006.01) |
| H01L 21/3065 | (2006.01) |
| H01L 21/308 | (2006.01) |

(52) U.S. Cl.
CPC ........ *H01L 29/7853* (2013.01); *H01L 21/308* (2013.01); *H01L 21/3065* (2013.01); *H01L 29/0653* (2013.01); *H01L 29/1037* (2013.01); *H01L 29/66818* (2013.01)

(58) Field of Classification Search
CPC .......... H01L 27/0086; H01L 29/66795; H01L 29/66818; H01L 29/785
USPC .................................... 257/401, 619
See application file for complete search history.

(56) References Cited

U.S. PATENT DOCUMENTS

| 2007/0231997 A1* | 10/2007 | Doyle ............... H01L 29/66818 438/253 |
| 2008/0230832 A1* | 9/2008 | Cho ................... H01L 29/66795 257/327 |
| 2012/0086053 A1* | 4/2012 | Tseng ................ H01L 29/66795 257/288 |
| 2014/0319462 A1* | 10/2014 | Huang .................. H01L 29/785 257/18 |

* cited by examiner

*Primary Examiner* — Matthew E Warren
(74) *Attorney, Agent, or Firm* — Jianq Chyun IP Office

(57) ABSTRACT

A FinFET including a substrate, a plurality of insulators and a gate stack is provided. The substrate includes a plurality of trenches and at least one semiconductor fin between the trenches. The insulators are disposed in the trenches. The semiconductor fin includes a first portion embedded between the insulators; a necking portion disposed on the first portion, the necking portion being uncovered by the insulators; and a second portion disposed on the necking portion, wherein a width of the necking portion is less than a width of the first portion. The gate stack partially covers the semiconductor fin, the at least one recess and the insulators.

15 Claims, 17 Drawing Sheets

FIN FIELD EFFECT TRANSISTOR AND FABRICATING METHOD THEREOF

BACKGROUND

As the semiconductor devices keeps scaling down in size, three-dimensional multi-gate structures, such as the fin-type field effect transistors (FinFETs), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

Currently, fabrication of FinFETs always has yield loss issue due to considerable leakage current ($I_{off}$) resulted from unstable process and/or less process window. Accordingly, how to improve the yield loss issue due to considerable leakage current ($I_{off}$) is important.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
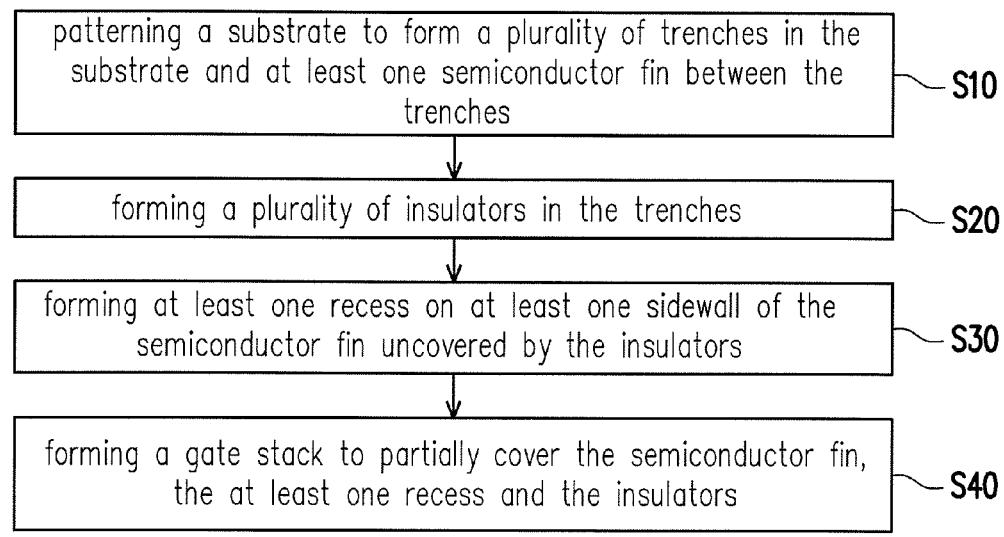
FIGS. 1, 2A and 2B are flow charts illustrating a method for fabricating a FinFET in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a FinFET. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

Figure 2A:
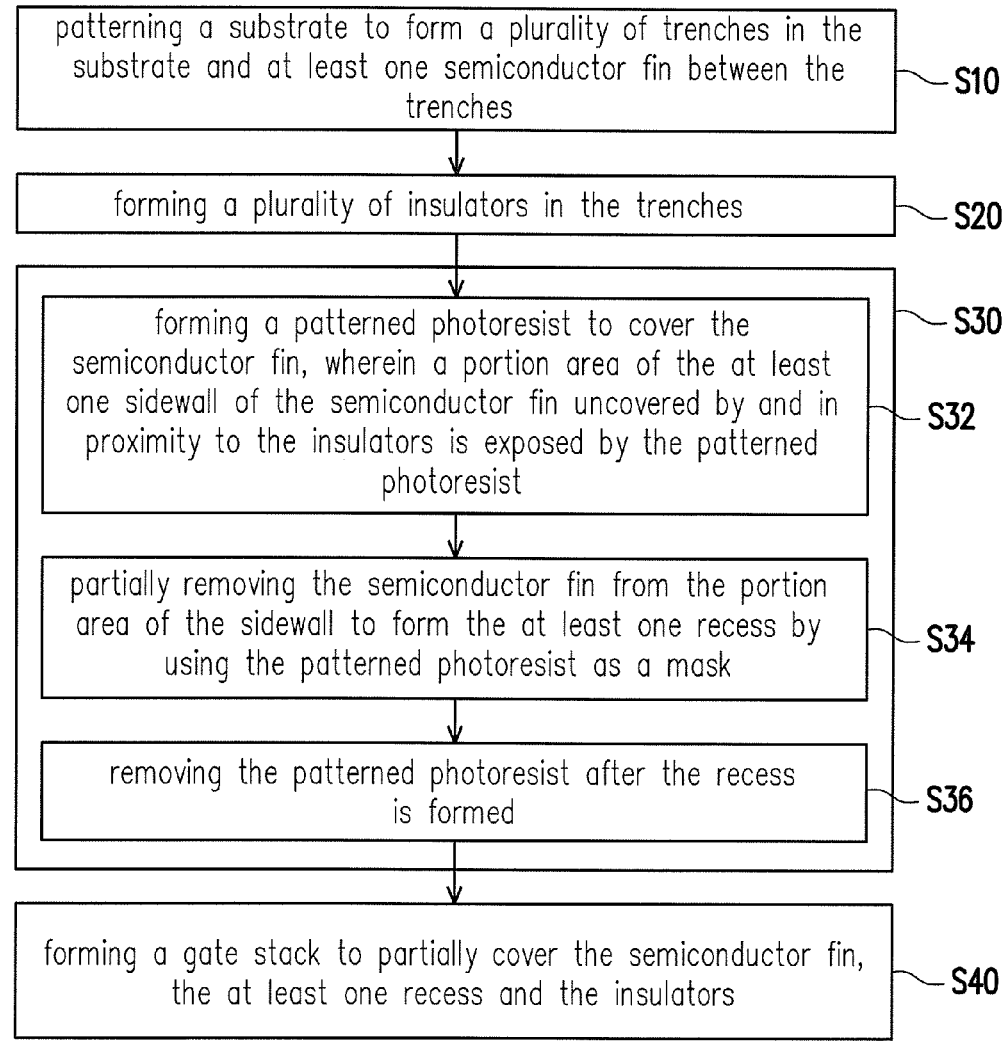
Figure 2B:
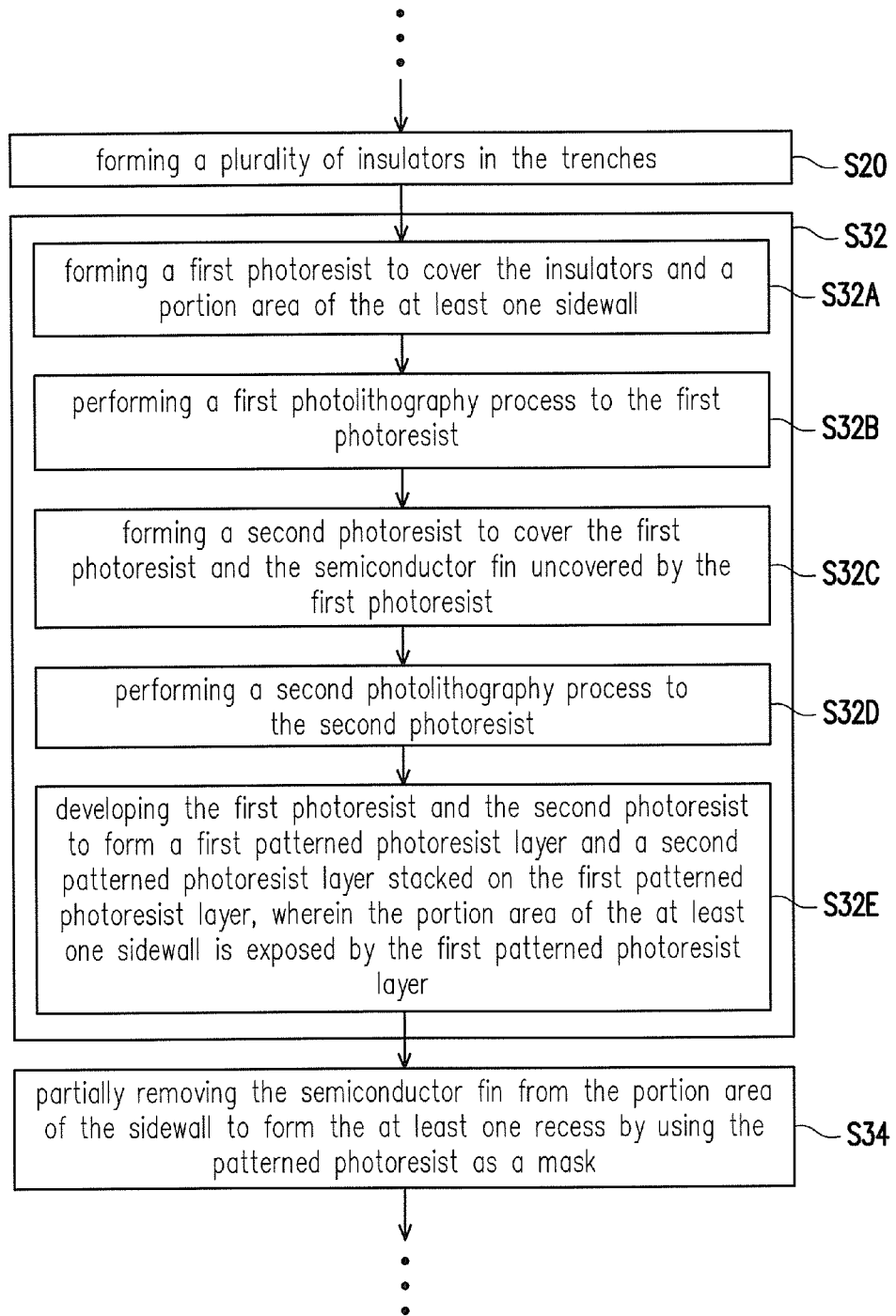

FIG. 1, FIG. 2A and FIG. 2B illustrate flow charts illustrating a method for fabricating a FinFET in accordance with some embodiments of the present disclosure. Referring to FIG. 1, the method at least includes step S10, step S20, step S30 and step S40. First, in step S10, a substrate is patterned to form a plurality of trenches in the substrate and at least one semiconductor fin between the trenches. Then, in step S20, a plurality of insulators are formed on the substrate and in the trenches. The insulators are shallow trench isolation (STI) structures for insulating semiconductor fins, for example. In step S30, at least one recess is formed on at least one sidewall of the semiconductor fin uncovered by the insulators. Thereafter, in step S40, a gate stack is formed to partially cover the semiconductor fin, the at least one recess and the insulators.

Figure 3A:
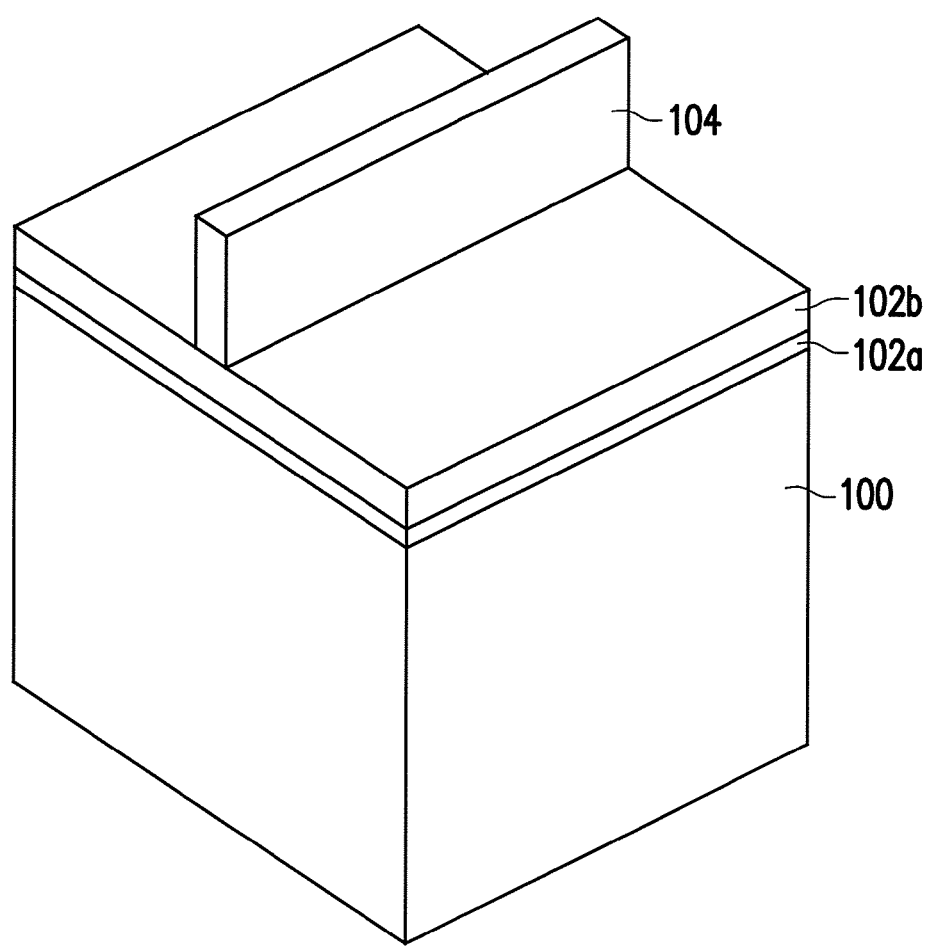
FIGS. 3A-3N are perspective views of a method for fabricating a semiconductor device in accordance with some embodiments.

FIG. 3A is a perspective view of the semiconductor device at one of various stages of the manufacturing method. In Step S10 in FIG. 1 and as shown in FIG. 3A, a substrate 100 is provided. In one embodiment, the substrate 100 comprises a crystalline silicon substrate (e.g., wafer). The substrate 100 may comprise various doped regions depending on design requirements (e.g., p-type substrate or n-type substrate). In some embodiments, the doped regions may be doped with p-type and/or n-type dopants. For example, the doped regions may be doped with p-type dopants, such as boron or $BF_2$; n-type dopants, such as phosphorus or arsenic; and/or combinations thereof. The doped regions may be configured for an n-type FinFET, a p-type FinFET or the combination thereof. In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 102a and a mask layer 102b are sequentially formed on the substrate 100. The pad layer 102a may be a silicon oxide thin film formed, for example, by thermal oxidation process. The pad layer 102a may act as an adhesion layer between the substrate 100 and mask layer 102b. The pad layer 102a may also act as an etch stop layer for etching the mask layer 102b. In at least one embodiment, the mask layer 102b is a silicon nitride layer formed, for example, by low-pressure chemical vapor deposition (LPCVD) or plasma enhanced chemical vapor deposition (PECVD). The mask layer 102b is used as a hard mask during subsequent photolithography processes. Then, a patterned photoresist layer 104 having a predetermined pattern is formed on the mask layer 102b.

Figure 3B:
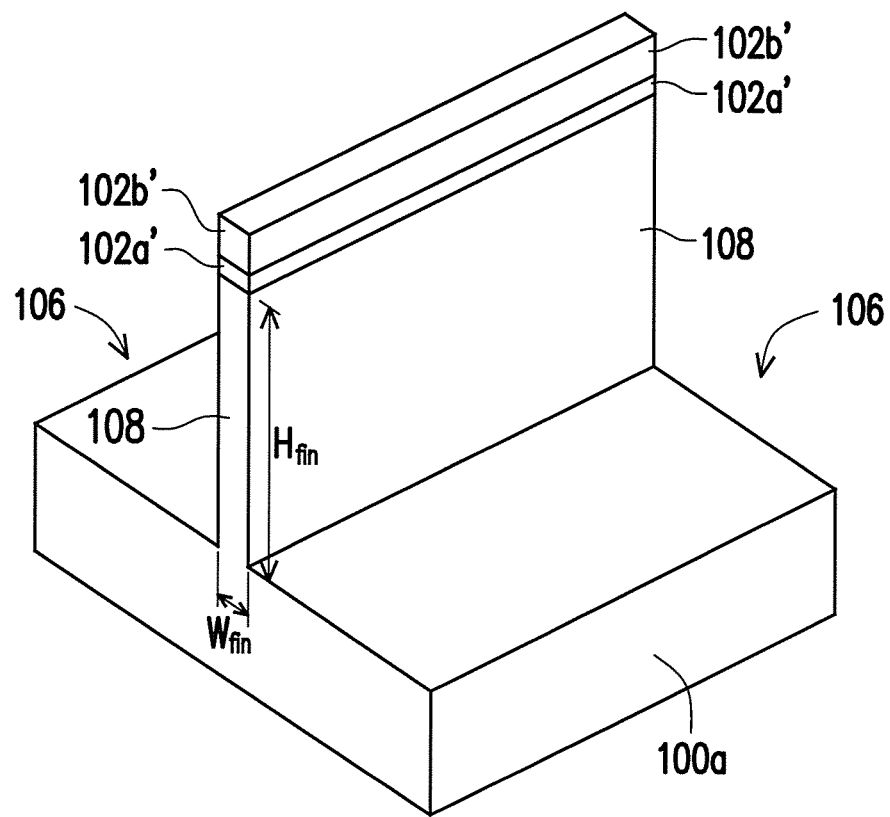

FIG. 3B is a perspective view of the semiconductor device at one of various stages of the manufacturing method. In Step S10 in FIG. 1 and as shown in FIGS. 3A-3B, the mask layer 102b and the pad layer 102a which are not covered by the patterned photoresist layer 104 are sequentially etched to form a patterned mask layer 102b' and a patterned pad layer 102a' so as to expose underlying substrate 100. By using the patterned mask layer 102b', the patterned pad layer 102a' and the patterned photoresist layer 104 as a mask, portions of the substrate 100 are exposed and etched to form trenches 106 and at least one semiconductor fin 108. The number of the semiconductor fin 108 shown in FIG. 3B is merely for illustration, in some alternative embodiments, two or more parallel semiconductor fins may be formed in accordance with actual design requirements. After the substrate 100 is patterned, the semiconductor fin 108 is covered by the patterned mask layer 102b', the patterned pad layer 102a' and the patterned photoresist layer 104. Two adjacent trenches 106 are spaced apart from each other by a semiconductor fin 108. For example, the semiconductor fin 108 has a width $W_{fin}$ and a height $H_{fin}$. The height $H_{fin}$ of the semiconductor fin 108 is substantially equal to the depth of the trenches 106.

After the trenches 106 and the semiconductor fin 108 are formed, the patterned photoresist layer 104 is then removed from a top surface of the patterned mask layer 102b'. In one embodiment, an optional cleaning process may be performed to remove a native oxide of the semiconductor substrate 100a and the semiconductor fin 108. The cleaning process may be performed using diluted hydrofluoric (DHF) acid or other suitable cleaning solutions.

Figure 3C:
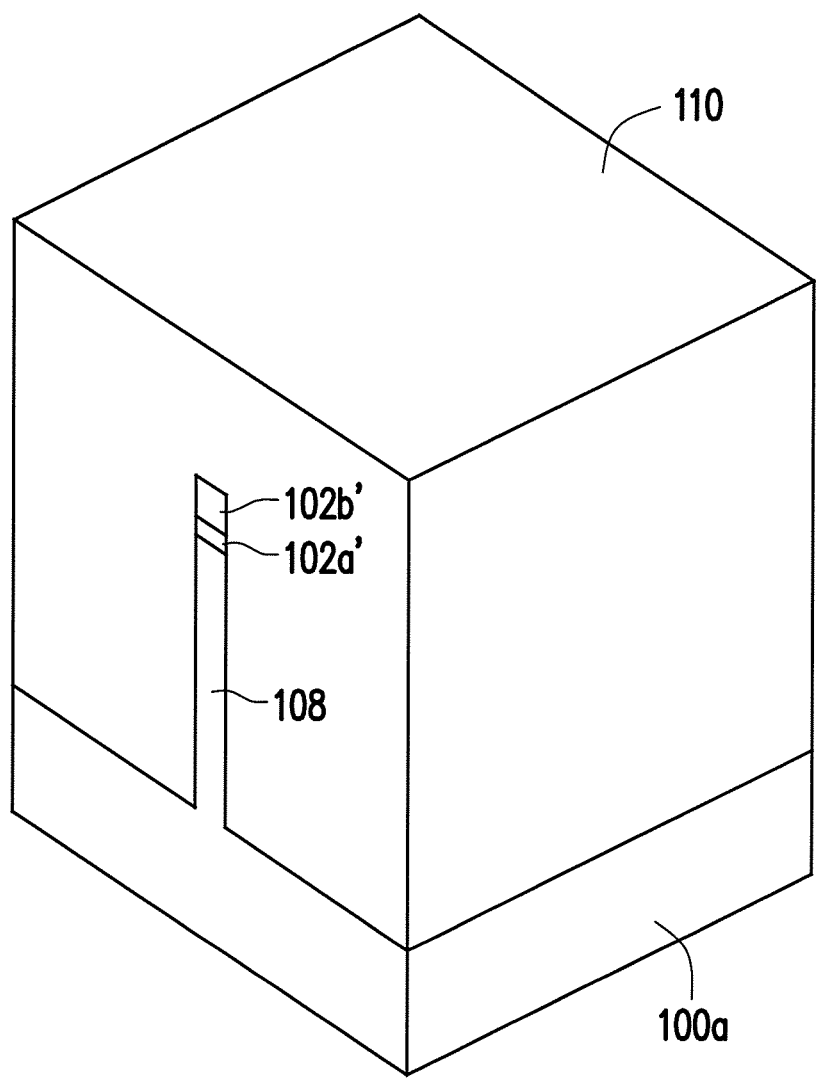

FIG. 3C is a perspective view of the semiconductor device at one of various stages of the manufacturing method. In Step S20 in FIG. 1 and as shown in FIGS. 3B-3C, an insulating material 110 are formed over the substrate 100a to cover the semiconductor fin 108 and fill up the trenches 106. In addition to the semiconductor fin 108, the insulating material 110 further covers the patterned pad layer 102a' and the patterned mask layer 102b'. The insulating material 110 may include silicon oxide, silicon nitride, silicon oxynitride, a spin-on dielectric material, or a low-K dielectric material. The insulating material 110 may be foil red by high-density-plasma chemical vapor deposition (HDP-CVD), sub-atmospheric CVD (SACVD) or by spin-on.

Figure 3D:
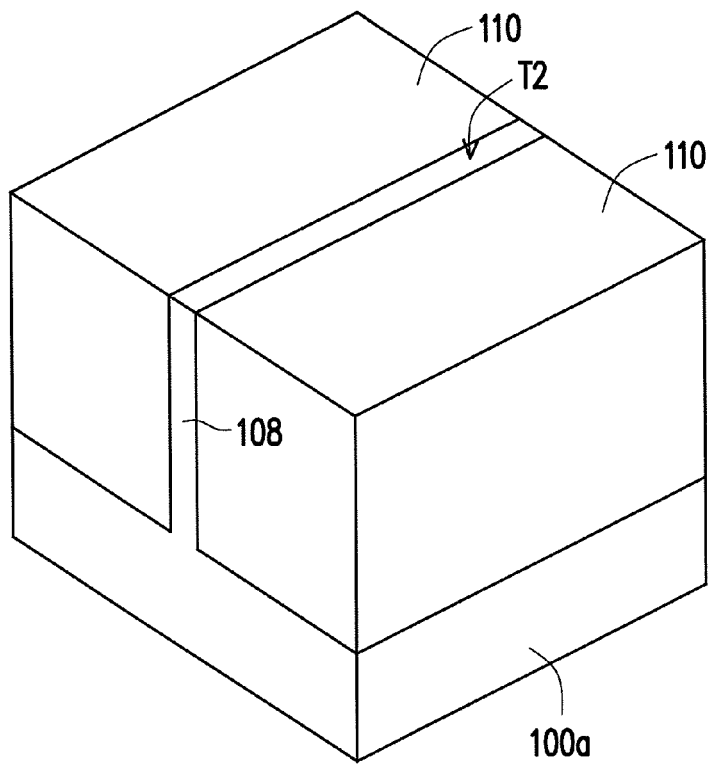

FIG. 3D is a perspective view of the semiconductor device at one of various stages of the manufacturing method. In Step S20 in FIG. 1 and as shown in FIGS. 3C-3D, a chemical mechanical polish process (CMP) is, for example, performed to remove a portion of the insulating material 110, the patterned mask layer 102b' and the patterned pad layer 102a' until a top surface T2 of the semiconductor fin 108 is exposed. As shown in FIG. 3D, after the insulating material 110 is polished, a top surface of the polished and remaining insulating material 110 is substantially coplanar with a top surface T2 of the semiconductor fin 108.

Figure 3E:
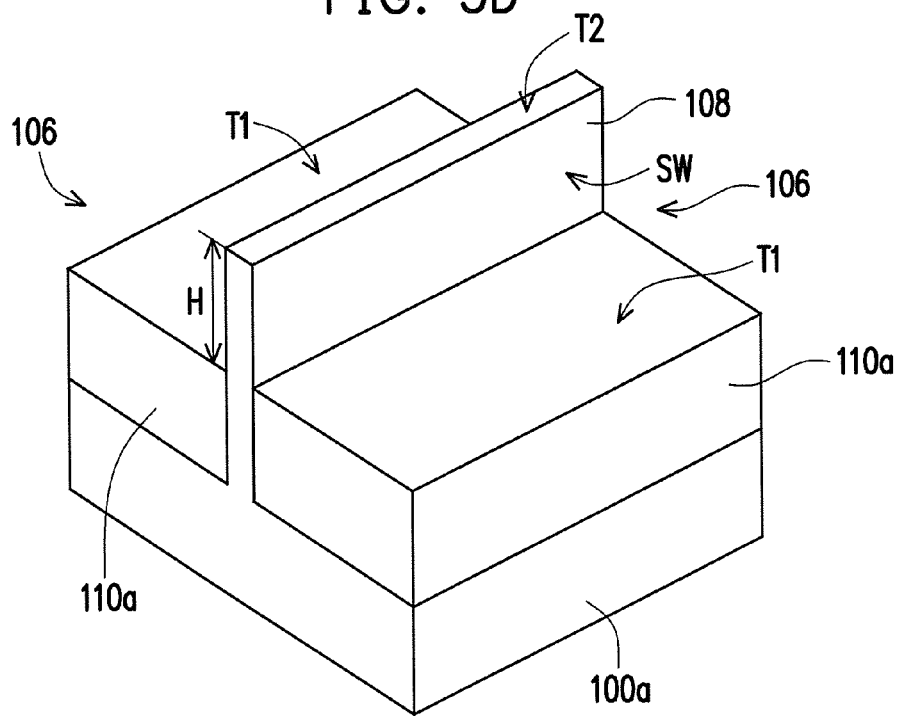

FIG. 3E is a perspective view of the semiconductor device at one of various stages of the manufacturing method. In Step S20 in FIG. 1 and as shown in FIGS. 3D-3E, the polished and remaining insulating material 110 filled in the trenches 106 is partially removed by an etching process such that a plurality of insulators 110a are formed on the substrate 100a and each insulator 110a is located in one of the trenches 106 correspondingly. In one embodiment, the etching process may be a wet etching process with hydrofluoric acid (HF) or a dry etching process. The top surfaces T1 of the insulators 110a are lower than the top surface T2 of the semiconductor fin 108. In other words, the semiconductor fin 108 protrudes from the top surfaces T1 of the insulators 110a and sidewalls SW of the semiconductor fin 108 are thus exposed. The height difference between the top surface T2 of the semiconductor fin 108 and the top surfaces T1 of the insulators 110a is H.

After the insulators 110a shown in FIG. 3E are formed, the step S30 illustrated in FIG. 1 are performed. Detailed descriptions of the step S30 are discussed in accompany with FIG. 2A and FIG. 2B.

As illustrated in FIG. 2A, step S30 illustrated in FIG. 1 may further include step S32, step S34 and step S36. In step S32, a patterned photoresist is formed to cover the semiconductor fin, wherein a portion area of the at least one sidewall of the semiconductor fin that is uncovered by and in proximity to the insulators is exposed by the patterned photoresist. In step S34, the semiconductor fin is partially removed from the portion area of the sidewall exposed by the patterned photoresist so as to fo in the at least one recess by using the patterned photoresist as a mask. In step S36, the patterned photoresist is removed after the recess is formed.

Furthermore, as illustrated in FIG. 2B, in some embodiments, the above-mentioned step S32 may further include step S32A, step S32B, step S32C, step S32D and step S32E. In other words, the patterned photoresist may include two or more stacked patterned photoresist layers and the stacked patterned photoresist layers may have different patterns, for example. In step S32A, a first photoresist is formed to cover the insulators and a portion area of the at least one sidewall. In step S32B, a first photolithography process is performed to the first photoresist. In step S32C, a second photoresist is formed to cover the first photoresist and the semiconductor fin that is uncovered by the first photoresist. In step S32D, a second photolithography process is performed to the second photoresist. In step S32E, the first photoresist and the second photoresist are developed to form a first patterned photoresist layer and a second patterned photoresist layer stacked on the first patterned photoresist layer, wherein the portion area of the at least one sidewall is exposed by the first patterned photoresist layer.

Figure 3F:
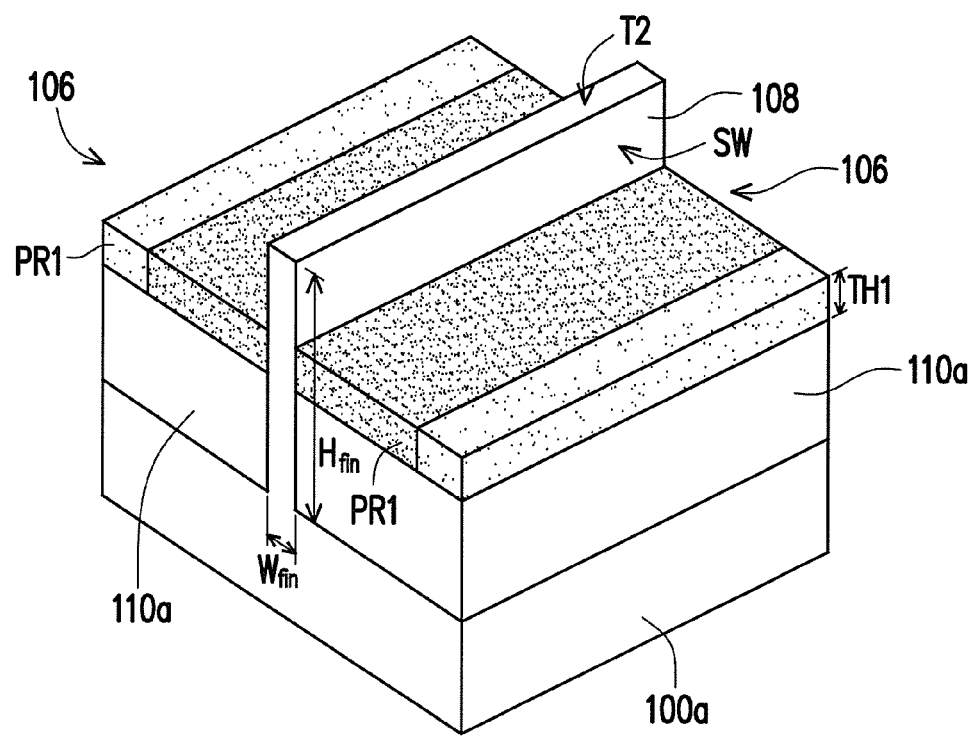

FIG. 3F is a perspective view of the semiconductor device at one of various stages of the manufacturing method. In Step S32A in FIG. 2B and as shown in FIGS. 3E-3F, a first photoresist PR1 is formed to cover the insulators 110a and a portion area of the at least one sidewall SW. In some embodiments, after the first photoresist PR1 is formed over the insulators 110a, two opposite sidewalls SW of the semiconductor fin 108 are partially covered by the first photoresist PR1. Specifically, portion areas of the sidewalls SW uncovered by and in proximity to the insulators 110a are covered by the first photoresist PR1. For example, the first photoresist PR1 is formed over the insulators 110a by spin-coating or other suitable processes. In some embodiments, the thickness TH1 of the first photoresist PR1 is smaller than the height $H_{fin}$ (shown in FIG. 3B) of the semiconductor fin 108.

In Step S32B in FIG. 2B and as shown in FIGS. 3E-3F, after the first photoresist PR1 is formed, a first photolithography process is then performed to the first photoresist PR1 such that a predetermined pattern is transferred onto the first photoresist PR1 through proper exposure.

Figure 3G:
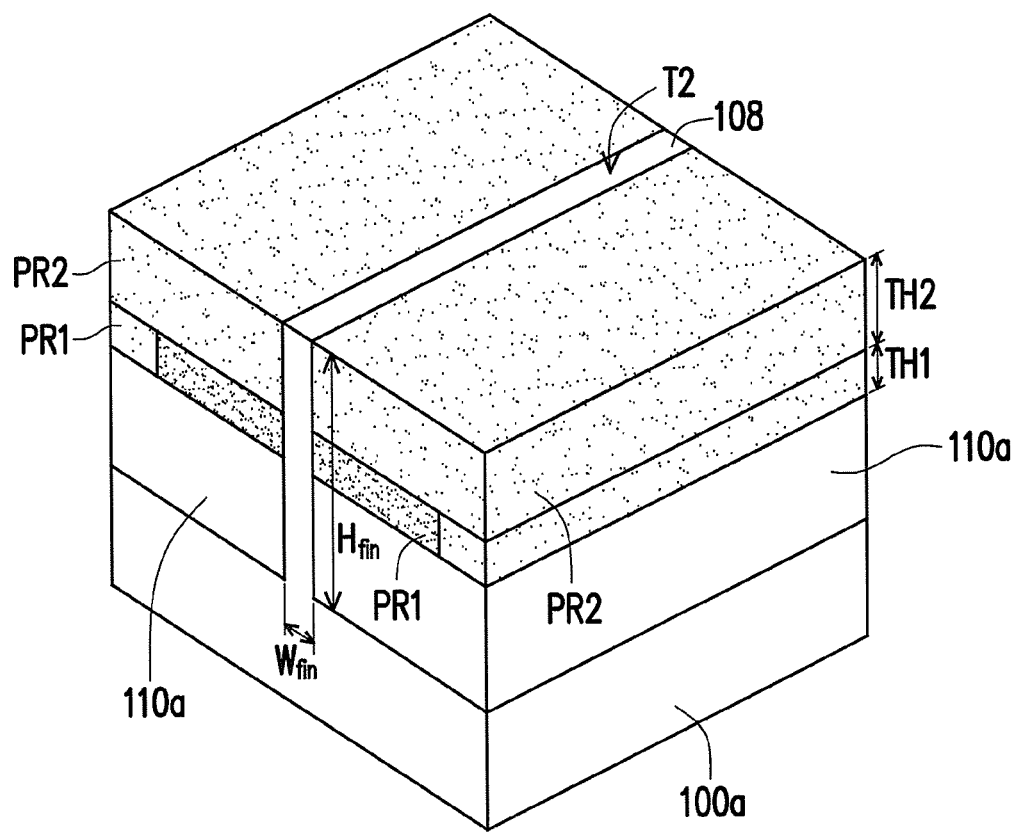

FIG. 3G is a perspective view of the semiconductor device at one of various stages of the manufacturing method. In Step S32C in FIG. 2B and as shown in FIGS. 3F-3G, a second photoresist PR2 is formed to cover the first photoresist PR1 and the semiconductor fin 108 that is uncovered by the first photoresist PR1. In some embodiments, after the second photoresist PR2 is formed over the first photoresist PR1, the first photoresist PR1 and the second photoresist PR2, for example, entirely covers two sidewalls SW of the semiconductor fin 108. The second photoresist PR2 is formed over the first photoresist PR1 by spin-coating or other suitable processes, for example. In some embodiments, the thickness TH2 of the second photoresist PR2 is smaller than the height $H_{fin}$ (shown in FIG. 3B) of the semiconductor fin 108. In other embodiments, the sum of the thickness TH1 of the first photoresist PR1 and the thickness TH2 of the second photoresist PR2 is substantially equal to the height difference H (as shown in FIG. 3E).

It is noted that the above-mentioned first photoresist PR1 and the second photoresist PR2 may be negative type photoresist materials or positive type photoresist materials.

In Step S32D in FIG. 2B and as shown in FIGS. 3F-3G, after the second photoresist PR2 is formed, a second photolithography process is then performed to the second photoresist PR2 such that another predetermined pattern is transferred onto the second photoresist PR2 through proper exposure. In some embodiments, the exposure time of the first photolithography process performed to the first photoresist PR1 is greater than the exposure time of the second photolithography process performed to the second photoresist PR2. In some alternative embodiments, the exposure time of the first photolithography process performed to the first photoresist PR1 is substantially equal to or greater than five times of the exposure time of the second photolithography process performed to the second photoresist PR2.

Figure 3H:
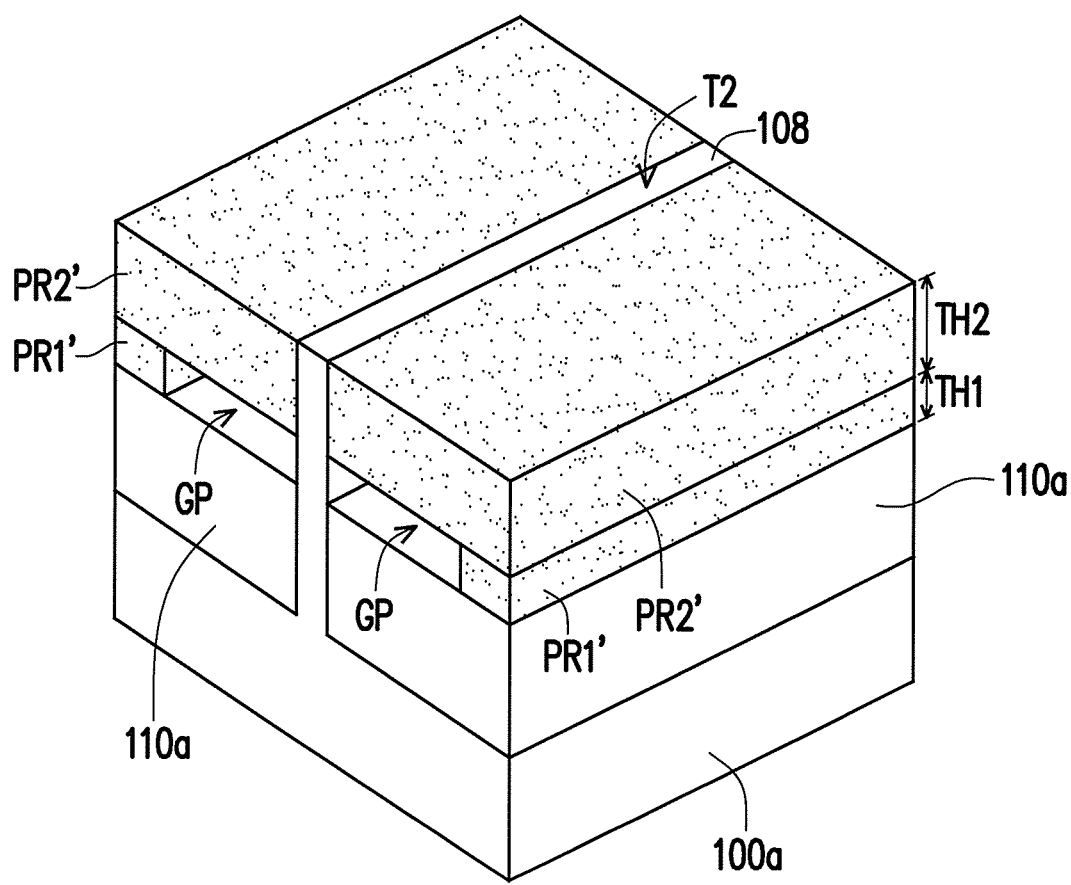

FIG. 3H is a perspective view of the semiconductor device at one of various stages of the manufacturing method. In Step S32E in FIG. 2B and as shown in FIGS. 3G-3H, the first photoresist PR1 and the second photoresist PR2 are developed to form a first patterned photoresist layer PR1' and a second patterned photoresist layer PR2' stacked on the first patterned photoresist layer PR1'. After development, wherein the portion areas, which are originally in contact with the first photoresist PR1, of the sidewalls SW (as shown in FIG. 3G) are exposed by the first patterned photoresist layer PR1'.

As shown in FIG. 3H, the first patterned photoresist layer PR1' is not in contact with the sidewalls SW of the semiconductor fin 108 and one or more gap(s) GP is formed between the first patterned photoresist layer PR1' and the sidewalls SW of the semiconductor fin 108. Further, the second patterned photoresist layer PR2' covers the gap GP and the first patterned photoresist layer PR1'. Further, the second patterned photoresist layer PR2' is in contact with the sidewalls SW of the semiconductor fin 108.

Figure 3I:
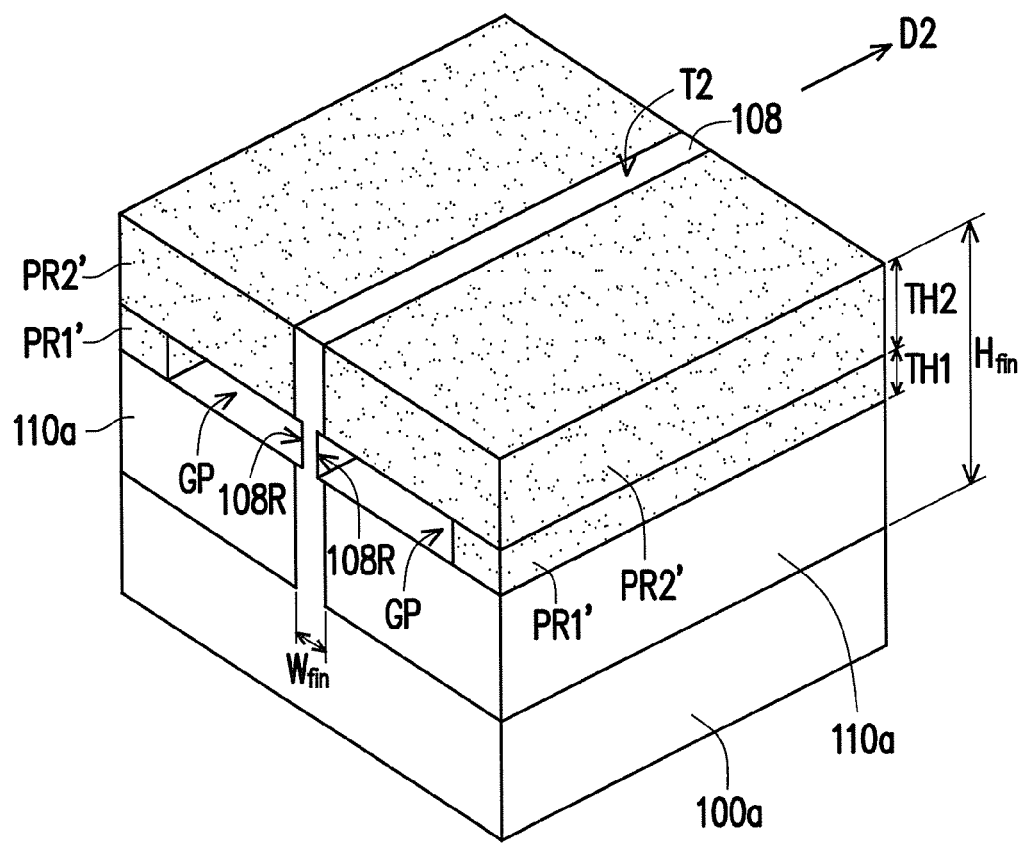
Figure 4:
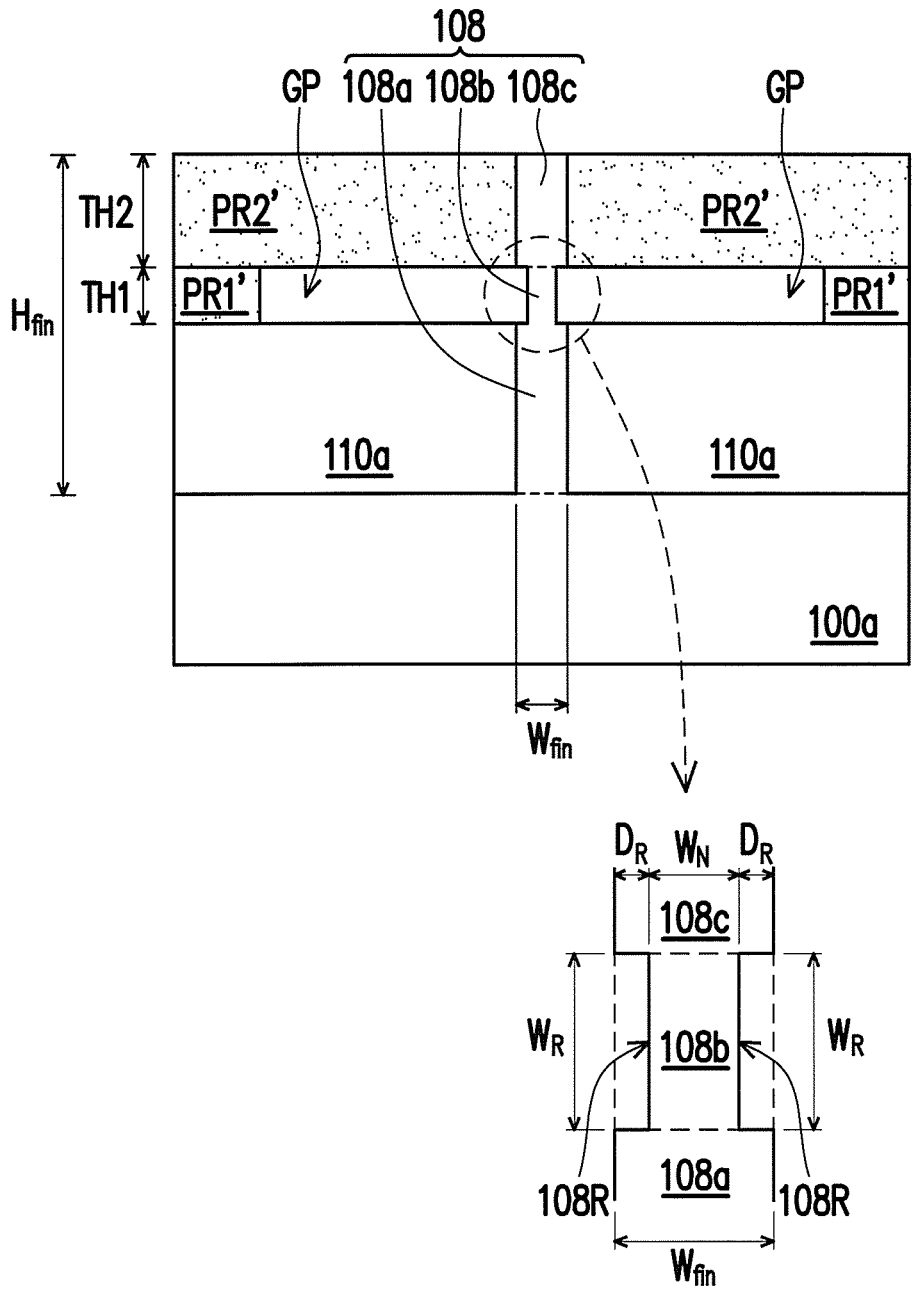
FIG. 4 is a cross-sectional view taken along the line I-I' of FIG. 3I.

FIG. 3I is a perspective view of the semiconductor device at one of various stages of the manufacturing method, and FIG. 4 is a cross-sectional view taken along the line I-I' of FIG. 3I. In Step S34 in FIGS. 2A-2B and as shown in FIGS. 3H-3I, after the first patterned photoresist layer PR1' and the second patterned photoresist layer PR2' are formed, the semiconductor fin 108 is partially removed from the portion areas of the sidewalls SW exposed by the patterned photoresist (e.g., the combination of the first patterned photoresist layer PR1' and the second patterned photoresist layer PR2') such that the at least one recess 108R is formed on the sidewalls SW of the semiconductor fin 108 by using the patterned photoresist (PR1' and PR2') as a mask. In some embodiments, a wet etch is performed to form the recesses 108R (e.g., a first recess and a second recess) by using the first patterned photoresist layer PR1' and the second patterned photoresist layer PR2' as an etch mask.

As shown in FIG. 3I and FIG. 4, each one of the recesses (e.g., a first recess and a second recess) 108R may have the same width $W_R$, and each one of the recesses (e.g., a first recess and a second recess) 108R may have the same depth $D_R$. Further, the recesses 108R extends along a lengthwise direction D2 of the semiconductor fin 108, for example. In some embodiments, the depth $D_R$ of the recesses 108R is smaller than the width $W_{fin}$ of the semiconductor fin 108. In some embodiments, the width $W_R$ of the recess 108R is smaller than the height $H_{fin}$ of the semiconductor fin 108.

It is noted that the width $W_R$ of the recess 108R is relevant to the thickness TH1 of the first patterned photoresist layer PR1' and/or the dimension of the gap GP. In some embodiments, the width $W_R$ of the recess 108R is substantially equal to the thickness TH1 of the first patterned photoresist layer PR1'. In alternative embodiments, the width $W_R$ of the recess 108R is slightly greater than the thickness TH1 of the first patterned photoresist layer PR1'.

As shown in FIG. 3I and FIG. 4, after the recesses 108R are formed, the semiconductor fin 108 are divided into at least three connected portions including a first portion 108a embedded between the insulators 110a, a necking portion 108b disposed on the first portion 108a and a second portion 108c disposed on the necking portion 108b, wherein the necking portion 108b is uncovered by the insulators 110a, the width $W_N$ of the necking portion 108b is less than the width $W_{fin}$ of the first portion 108a and/or the second portion 108c. The width difference between the necking portion 108b and the first portion 108a is twice of the depth $D_R$ of the recesses 108R (i.e., $W_{fin}-W_N=2D_R$). In some embodiments, the width $W_N$ of the necking portion 108b is smaller than the width $W_{fin}$ of the first portion 108a. In some embodiments, the height of the necking portion 108b (i.e., the width $W_R$ of the recesses 108R) is smaller than the height $H_{fin}$ of the semiconductor fin 108.

It is noted that the height of the first portion 108a is relevant to the thickness of the insulators 110a, the height of the necking portion 108b (i.e., the width $W_R$ of the recesses 108R) is relevant to the thickness TH1 of the first patterned photoresist layer PR1', and the height of the second portion 108c is relevant to the thickness TH2 of the second patterned photoresist layer PR2'. By adjusting the thicknesses of the insulators 110a, the first patterned photoresist layer PR1' and the second patterned photoresist layer PR2, one ordinary skilled in the art may modify the dimensions of the first portion 108a, the necking portion 108b and the second portion 108c so as to obtain desired profile of the semiconductor 108.

Figure 3J:
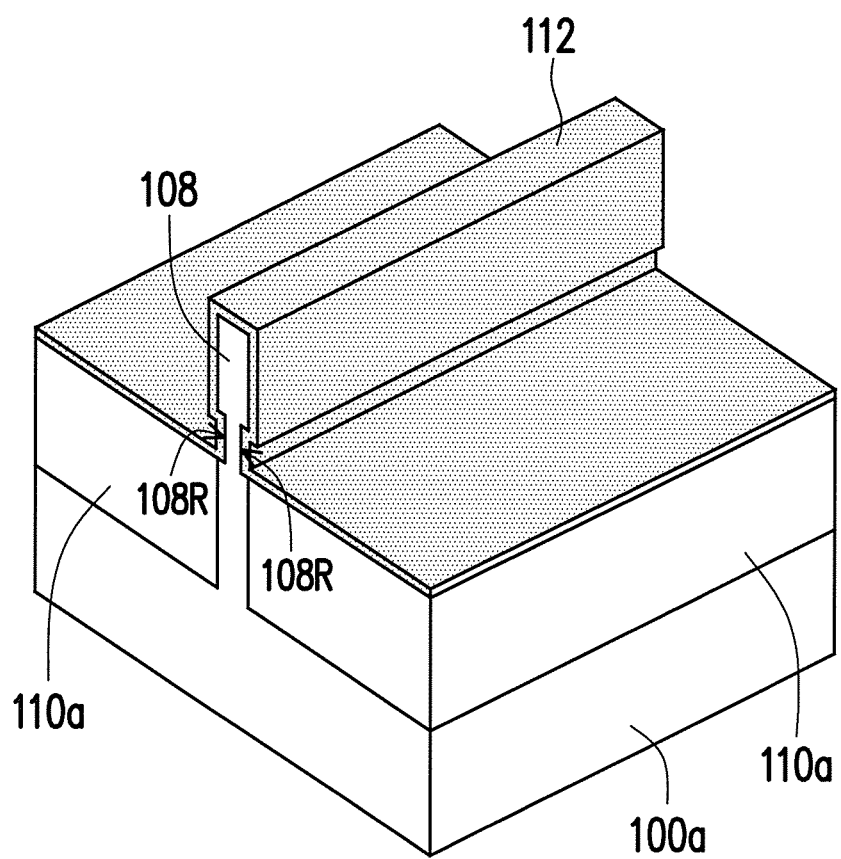

FIG. 3J is a perspective view of the semiconductor device at one of various stages of the manufacturing method. In Step S36 in FIG. 2A and as shown in FIGS. 3I-3J, after the recesses 108R are formed, the first patterned photoresist layer PR1' and the second patterned photoresist layer PR2' are removed.

In Step S40 in FIG. 1 and FIG. 2A, formation of a gate stack GS (shown in FIG. 3N) is performed so as to partially cover the semiconductor fin 108, the recesses 108R and the insulators 110a. The formation of the gate stack GS (shown in FIG. 3N) is discussed in accompany with FIG. 3J through FIG. 3N.

As shown in FIG. 3J, after the first patterned photoresist layer PR1' and the second patterned photoresist layer PR2' are removed, and a gate dielectric layer 112 is formed to conformally cover the insulators 110a and the semiconductor fin 108 having recesses 108R. In one embodiment, the gate dielectric layer 112 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, T, Yb, Lu, and/or mixtures thereof. In one embodiment, the gate dielectric layer 112 is a high-k dielectric layer with a thickness in the range of about 0.2 nm to 50 nm. The gate dielectric layer 112 may be formed by a suitable process such as atomic layer deposition (ALD), chemical vapor deposition (CVD), physical vapor deposition (PVD), thermal oxidation or UV-ozone oxidation. The gate dielectric layer 112 has good quality to serve as a gate dielectric layer in a FinFET.

Figure 3K:
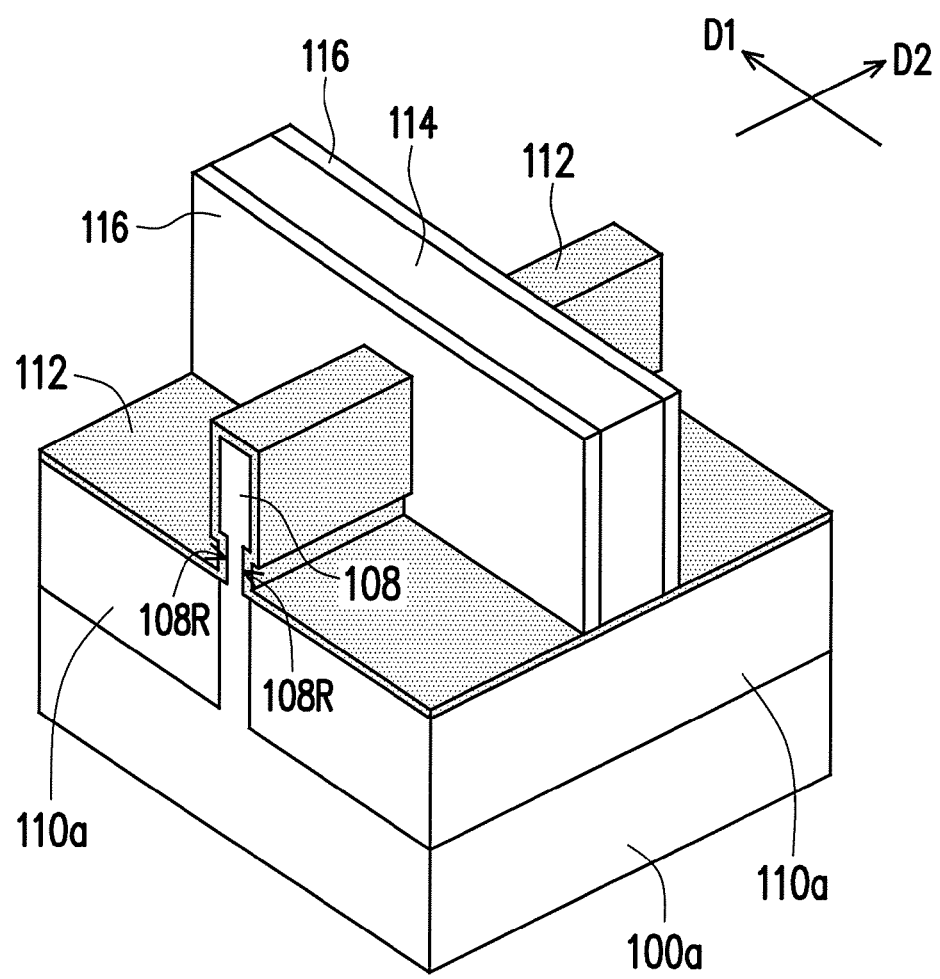

FIG. 3K is a perspective view of the semiconductor device at one of various stages of the manufacturing method. Referring to FIGS. 3J-3K, at least one dummy gate strip 114 is formed on the gate dielectric layer 112, wherein a lengthwise direction D1 of the dummy gate strip 114 is different from the lengthwise direction D2 of the semiconductor fin 108. In some embodiments, the lengthwise direction D1 of the dummy gate strip 114 is perpendicular to the lengthwise direction D2 of the semiconductor fin 108. The number of the dummy gate strip 114 shown in FIG. 3K is merely for illustration, in some alternative embodiments, two or more parallel dummy gate strips may be formed in accordance with actual design requirements. The dummy gate strip 114 includes silicon-containing material, such as poly-silicon, amorphous silicon or a combination thereof.

As shown in FIG. 3K, after the dummy gate strip 114 is forming, a pair of spacers 116 are formed on sidewalls of the dummy gate strip 114. The pair of spacers 116 are formed on the gate dielectric layer 112 and extend along the sidewalls of the dummy gate strip 114. The pair of spacers 116 are formed of dielectric materials, such as silicon nitride or SiCON. The pair of spacers 116 may include a single layer or multilayer structure.

Figure 3L:
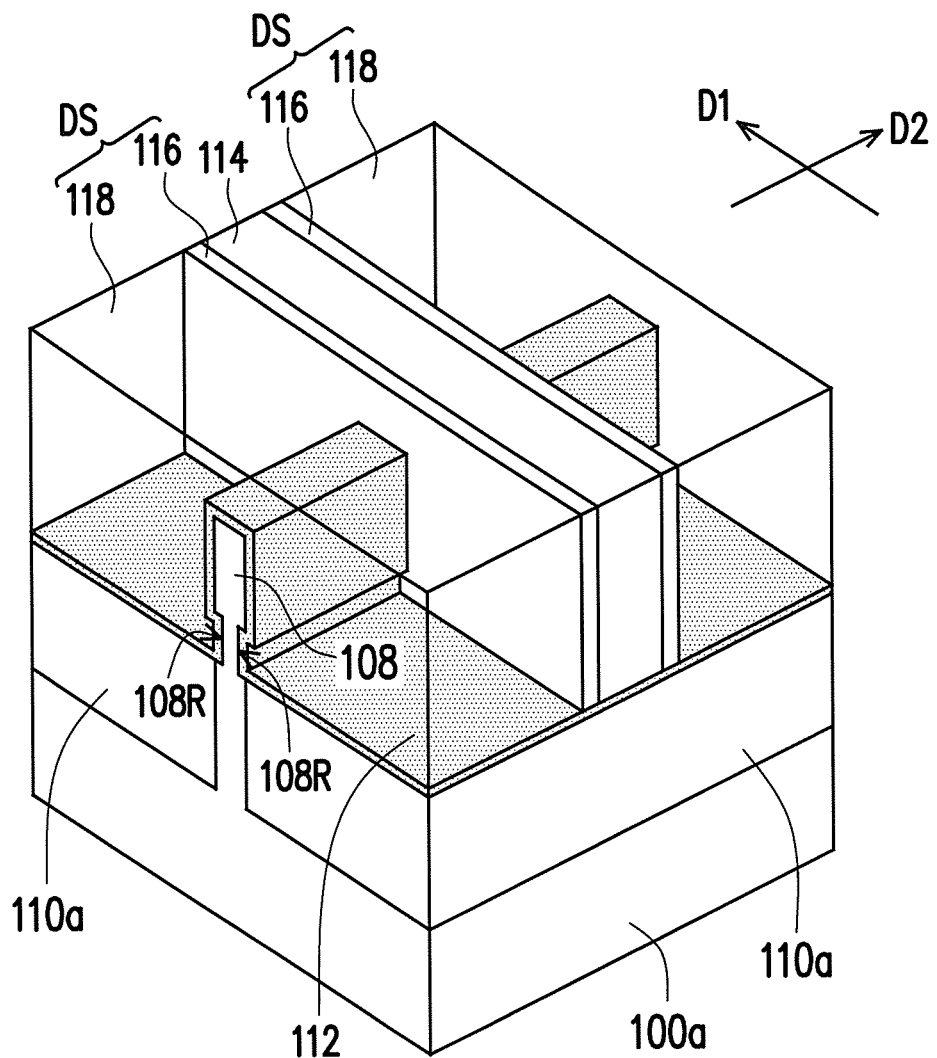

FIG. 3L is a perspective view of the semiconductor device at one of various stages of the manufacturing method. Referring to FIG. 3L, a patterned dielectric layer 118 is formed to cover the gate dielectric layer 112 that are not covered by the dummy gate strip 114 and the spacers 116. A top surface of the patterned dielectric layer 118 is substantially coplanar with the top surface of the dummy gate strip 114, for example. In some embodiments, before the patterned dielectric layer 118 is formed, some processes (e.g., patterning process of gate dielectric layer 112, semiconductor fin recessing process, strained source/drain epitaxial process on the semiconductor fin, silicidation process and so on) may be performed in advance. Details of the aforesaid optional processes are omitted.

As shown in FIG. 3L, in one embodiment, the pair of spacers 116 formed on the sidewalls of the dummy gate strip 114 may be considered as a dielectric structure DS adjacent to the dummy gate strip 114. In an alternative embodiment, the combination of the pair of spacers 116 and the patterned dielectric layer 118 may be considered as a dielectric structure DS adjacent to the dummy gate strip 114. In other words, the dummy gate strip 114 may be embedded in the dielectric structure DS and the dielectric structure DS partially covers the semiconductor fin 108 and the insulators 110a.

Figure 3M:
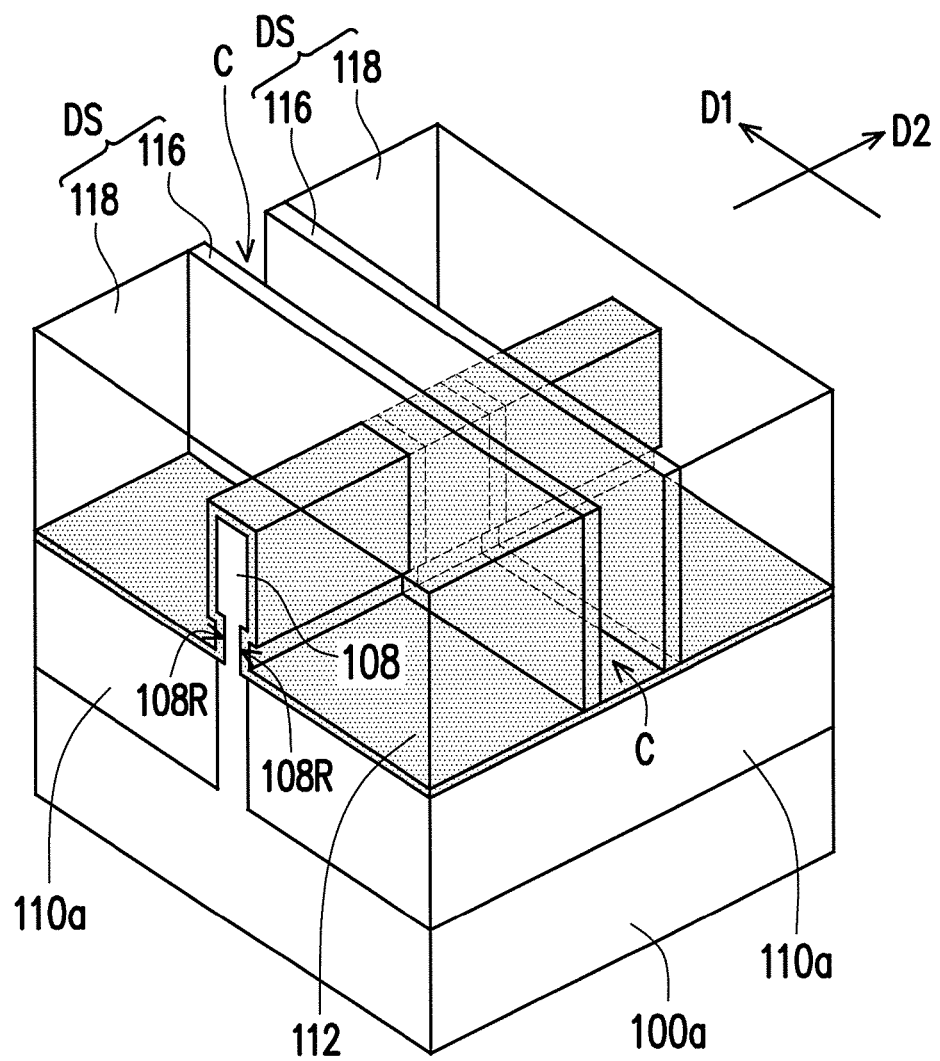

FIG. 3M is a perspective view of the semiconductor device at one of various stages of the manufacturing method. Referring to FIGS. 3L-3M, the dummy gate strip 114 is removed. In one embodiment, the dummy gate strip 114 is removed, for example, by an etching process. Through properly selecting of etchant, the dummy gate strip 114 is removed without damaging the patterned dielectric layers 118, the gate dielectric layer 112 and the spacers 116 significantly. After the dummy gate strip 114 is removed, a cavity C between the pair of spacers 116 is formed. In other words, the dielectric gate layer 112 is partially exposed by the cavity C.

Figure 3N:
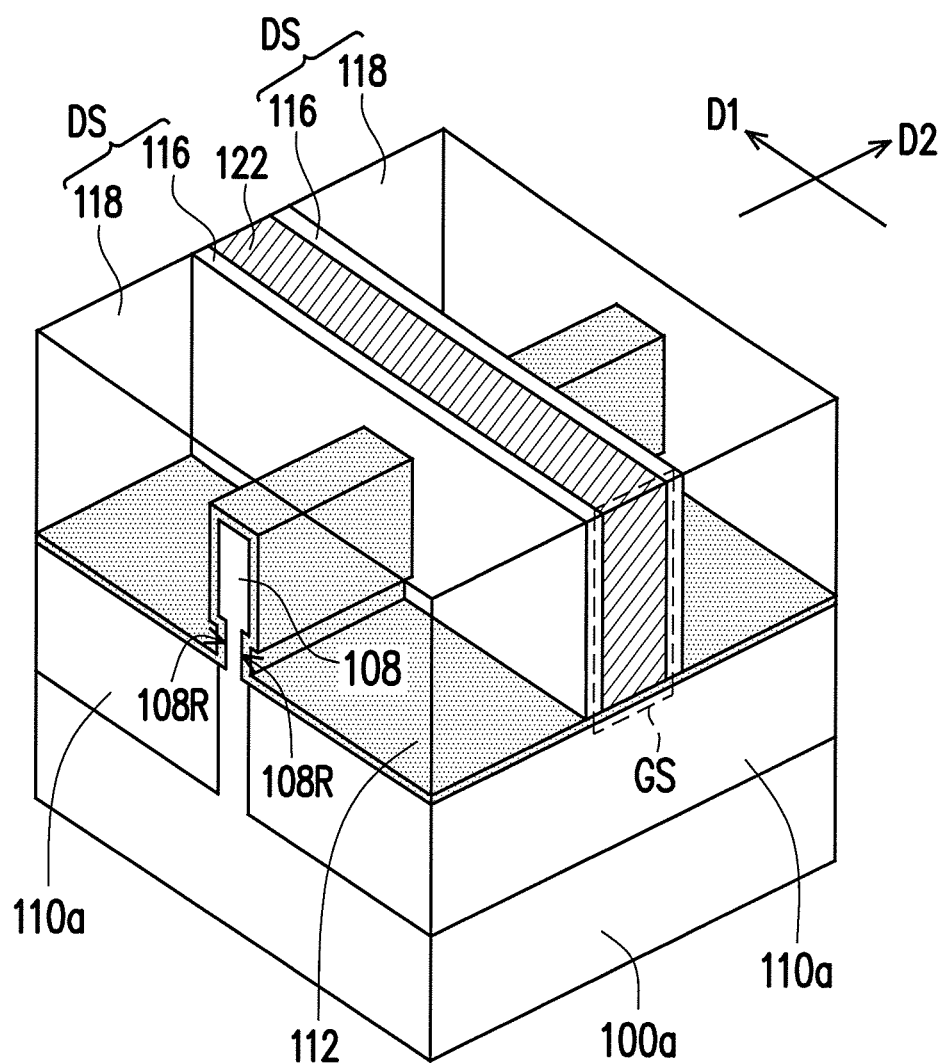

FIG. 3N is a perspective view of the semiconductor device at one of various stages of the manufacturing method. Referring to FIGS. 3M-3N, after the cavity C is formed, a gate 122 is formed in and fills the cavity C and the gate 122 covers the gate dielectric layer 112 exposed by the cavity C. The width of the gate 122 may be identical with the width of the dummy gate strip 114 (as shown in FIG. 3L). The channel length of the FinFET is relevant to or determined by the width of the gate 122. In other words, the portion of the semiconductor fin 108 that is overlapped with and covered by the gate 122 serves as a channel of a FinFET.

As shown in FIG. 3N, in one embodiment, the gate 122 and the gate dielectric layer 112 underneath are considered as a gate stack GS, the dielectric structure DS (e.g., the pair of spacers 116 or the combination of the pair of spacers 116 and the patterned dielectric layer 118) is formed on sidewalls of the gate stack GS, and the top surface of the dielectric structure DS is substantially coplanar with a top surface of the gate stack GS, for example. In alternative embodiments, the gate replacement process may be omitted.

Since the semiconductor fin of the FinFET includes recesses or necking portion, leakage current of the FinFET can be reduced. Accordingly, yield and reliability of the FinFET are improved.

In accordance with some embodiments of the present disclosure, a FinFET comprising a substrate, a plurality of insulators and a gate stack is provided. The substrate comprises a plurality of trenches and at least one semiconductor fin between the trenches. The insulators are disposed in the trenches. The semiconductor fin comprises at least one recess, the at least one recess is located on at least one sidewall of the semiconductor fin uncovered by the insulators. The gate stack partially covers the semiconductor fin, the at least one recess and the insulators.

In accordance with alternative embodiments of the present disclosure, a FinFET comprising a substrate, a plurality of insulators and a gate stack is provided. The substrate comprises a plurality of trenches and at least one semiconductor fin between the trenches. The insulators are disposed in the trenches. The semiconductor fin comprises a first portion embedded between the insulators; a necking portion disposed on the first portion, the necking portion being uncovered by the insulators; and a second portion disposed on the necking portion, wherein a width of the necking portion is less than a width of the first portion. The gate stack partially covers the semiconductor fin, the at least one recess and the insulators.

In accordance with yet alternative embodiments of the present disclosure, a method for fabricating a fin field effect transistor (FinFET) is provided, The method for fabricating a FinFET comprises: patterning a substrate to form a plurality of trenches in the substrate and at least one semiconductor fin between the trenches; forming a plurality of insulators in the trenches; forming at least one recess on at least one sidewall of the semiconductor fin uncovered by the insulators; and forming a gate stack to partially cover the semiconductor fin, the at least one recess and the insulators. The method for forming the at least one recess comprises: forming a patterned photoresist to cover the semiconductor fin, wherein a portion area of the at least one sidewall of the semiconductor fin uncovered by and in proximity to the insulators is exposed by the patterned photoresist; partially removing the semiconductor fin from the portion area of the sidewall to form the at least one recess by using the patterned photoresist as a mask; removing the patterned photoresist after the recess is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
a substrate comprising a plurality of trenches and at least one semiconductor fin between the trenches;
a plurality of insulators in the trenches, wherein the semiconductor fin comprises at least one recess, the at least one recess is located on at least one sidewall of the semiconductor fin uncovered by the insulators; and
a gate stack comprising a gate and a gate dielectric layer, the gate partially covering the semiconductor fin, the at least one recess and the insulators, and the gate dielectric layer covering the whole top surface of the insulators.

2. The FinFET of claim 1, wherein a depth of the at least one recess is smaller than a width of the semiconductor fin.

3. The FinFET of claim 1, wherein a width of the at least one recess is smaller than a height of the semiconductor fin.

4. The FinFET of claim 1, wherein the at least one recess extends along a lengthwise direction of the semiconductor fin.

5. The FinFET of claim 1, wherein the at least one recess comprises a first recess and a second recess located at two opposite sidewalls of the semiconductor fin.

6. The FinFET of claim 5, wherein a width of the first recess equals to the width of the second recess and a depth of the first recess equals to the depth of the second recess.

7. The FinFET of claim 5, wherein a sum of depths of the first recess and the second recess is smaller than a width of the semiconductor fin.

8. The FinFET of claim 5, wherein widths of the first recess and the second recess are smaller than a height of the semiconductor fin.

9. A fin field effect transistor (FinFET), comprising:
a substrate comprising a plurality of trenches and at least one semiconductor fin between the trenches;
a plurality of insulators in the trenches, the semiconductor fin comprising:
a first portion embedded between the insulators;
a necking portion disposed on the first portion, the necking portion being uncovered by the insulators;
a second portion disposed on the necking portion, wherein a width of the necking portion is less than a width of the first portion; and
a gate stack comprising a gate and a gate dielectric layer, the gate partially covering the semiconductor fin and the insulators, and the gate dielectric layer covering the whole top surface of the insulators.

10. The FinFET of claim 9, wherein the necking portion comprises at least one recess located on at least one sidewall of the semiconductor fin uncovered by the insulators.

11. The FinFET of claim 10, wherein the at least one recess extends along a lengthwise direction of the semiconductor fin.

12. The FinFET of claim 10, wherein a depth of the at least one recess is smaller than a width of the semiconductor fin and a width of the at least one recess is smaller than a height of the semiconductor fin.

13. The FinFET of claim 9, wherein the necking portion comprises a first recess and a second recess located at two opposite sidewalls of the semiconductor fin.

14. The FinFET of claim 13, wherein the first recess and the second recess extend along a lengthwise direction of the semiconductor fin.

15. The FinFET of claim 13, wherein a depth of the first recess equals to the depth of the second recess.

* * * * *